(12) United States Patent
Lee (10) Patent No.: US 8,159,508 B2
(45) Date of Patent: Apr. 17, 2012

(54) ELECTRO-LUMINESCENCE DISPLAY

(75) Inventor: Chung-Chun Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1083 days.

(21) Appl. No.: 11/778,652

(22) Filed: Jul. 17, 2007

(65) Prior Publication Data

US 2008/0231554 A1 Sep. 25, 2008

(30) Foreign Application Priority Data

Mar. 22, 2007 (TW) ............................... 96109979 A (51) Int. Cl.
*G09G 3/28* (2006.01)
(52) U.S. Cl. ..................... 345/690; 345/169.3; 313/582
(58) Field of Classification Search .................. 345/690; 315/169.3; 313/582; 445/24
See application file for complete search history.

(56) References Cited

U.S. PATENT DOCUMENTS

| | | | |
|---|---|---|---|
| 6,366,025 B1 | 4/2002 | Yamada | |
| 6,867,549 B2 * | 3/2005 | Cok et al. ................... | 315/169.3 |
| 7,030,553 B2 | 4/2006 | Winters | |
| 7,883,386 B2 * | 2/2011 | Ho et al. ......................... | 445/24 |
| 2004/0201558 A1 | 10/2004 | Arnold et al. | |
| 2005/0151462 A1 | 7/2005 | Miyagawa | |
| 2005/0212728 A1 | 9/2005 | Miller et al. | |
| 2005/0225548 A1 | 10/2005 | Han | |
| 2005/0225563 A1 * | 10/2005 | Brown Elliott et al. ...... | 345/604 |
| 2005/0231534 A1 * | 10/2005 | Lee ............................... | 345/690 |
| 2006/0238123 A1 * | 10/2006 | Kang ............................ | 313/582 |
| 2007/0001954 A1 * | 1/2007 | Shishido et al. ................ | 345/89 |

FOREIGN PATENT DOCUMENTS

TW I258721 7/2006

* cited by examiner

*Primary Examiner* — Amare Mengistu
*Assistant Examiner* — Joseph G Rodriguez
(74) *Attorney, Agent, or Firm* — Winston Hsu; Scott Margo (57) ABSTRACT

An electroluminescent display comprises a substrate with a plurality of pixel regions, wherein each pixel region has a first sub-pixel region, a second sub-pixel region, and a third sub-pixel region. Pluralities of first color light-emitting layers, second color light-emitting layers, and third color light-emitting layers are formed on the substrate. Each first color light-emitting layer is disposed in one first sub-pixel region, and each second color light-emitting layer is disposed in two adjacent second sub-pixel regions. The area of the first sub-pixel region is larger than the area of the second sub-pixel region in a single pixel region.

18 Claims, 9 Drawing Sheets

ELECTRO-LUMINESCENCE DISPLAY

BACKGROUND OF THE INVENTION

1. Field of the Invention

The invention is related to an electroluminescent display, and more particularly, to an electroluminescent display with improved lifetime.

2. Description of the Prior Art

In recent years, due to the successful development of organic materials, the organic light-emitting display (OLED) has been noticed in the display market because of its advantages such as simple structure, low working temperature, high contrast, and wide visual angle.

Figure 1:
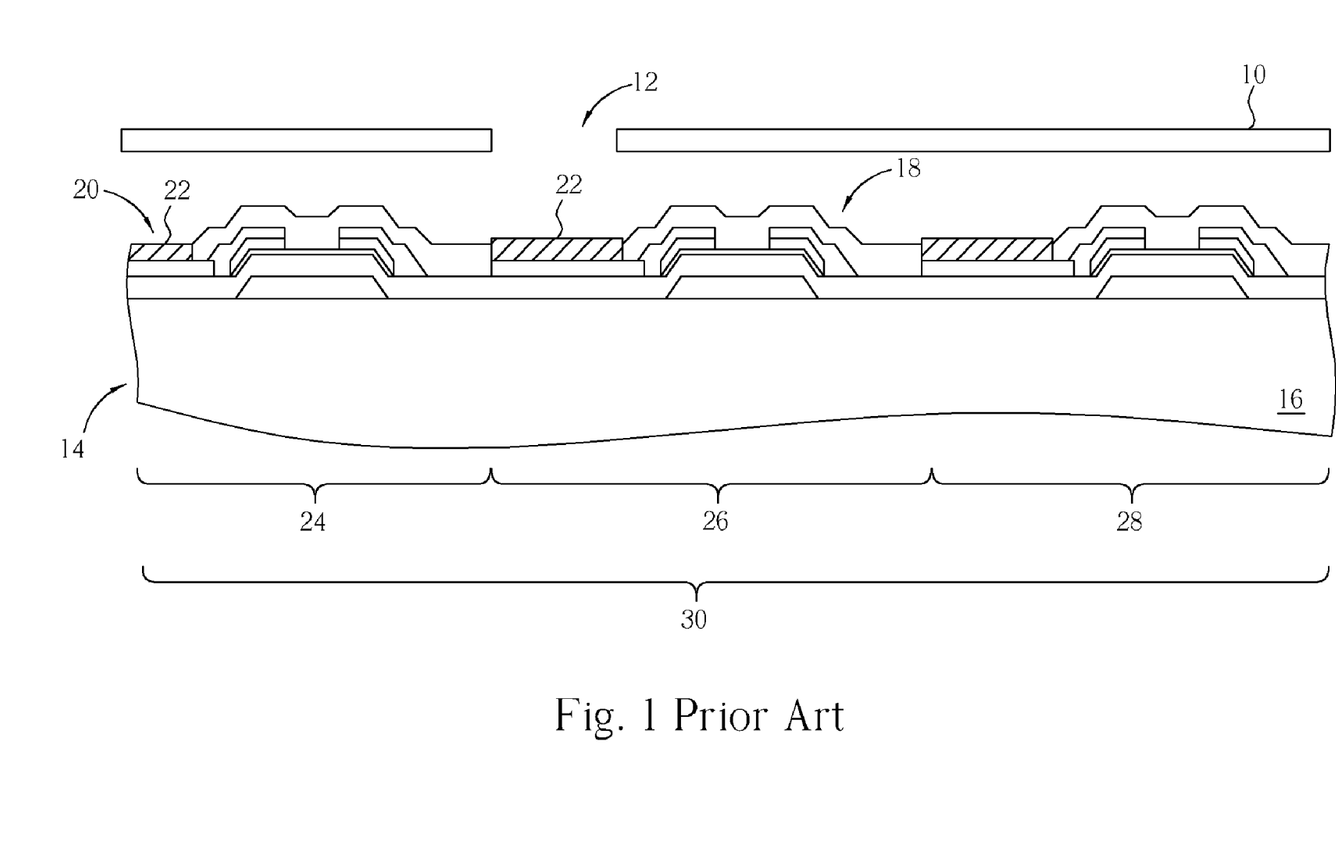
FIG. 1 is a schematic diagram of the manufacture method of organic light-emitting elements on a substrate according to the prior art.

Referring to FIG. 1, it is a schematic diagram of the method of fabricating organic light-emitting elements on a substrate according to the prior art. Generally, an OLED 14 comprises devices fabricated on a substrate 16, which has a plurality of pixel regions 30 defined thereon. Each pixel region 30 comprises at least three sub-pixel regions 24, 26, 28 to produce light with different colors, such as red light, green light, and blue light. Each of the sub-pixel regions 24, 26, 28 comprises at least one switch device, such as a thin-film transistor 18, to control the operation of the corresponding sub-pixel region 24, 26, or 28. In addition, an organic light-emitting element 20 is disposed in each of the sub-pixel regions 24, 26, 28 and electrically connected to the thin-film transistor 18, so that electrons and holes can be recombined in the light-emitting layer 22 of the organic light-emitting element 20 to produce light when the sub-pixel region 24, 26, or 28 is turned on. Furthermore, light sources with different colors need to be fabricated with different organic light-emitting materials. Here a traditional OLED composed of three kinds of sub-pixel regions, the red, green, and blue sub-pixel regions, is used as an example for explanation. When fabricating the organic light-emitting elements 20 for producing red light, green light, and blue light individually, the red, green, and blue light-emitting layers 22 need to be formed separately in the sub-pixel regions 24, 26, 28 respectively. For example, a first, a second, and a third shadow masks are used separately to fabricate the red, green, and blue light-emitting layers 22 in the corresponding sub-pixel regions 24, 26, 28, wherein each of the first, second, and third shadow masks has a plurality of openings for defining the positions of the red, green, or blue sub-pixel regions 24, 26, or 28. As indicated in FIG. 1, the green light-emitting layers 22 can be formed through the openings 12 of a first shadow mask 10 on the substrate 16, and then the light-emitting layers 22 with other colors can be formed through the openings of a second or a third shadow mask on the substrate 16 of the OLED 14.

Figure 2:
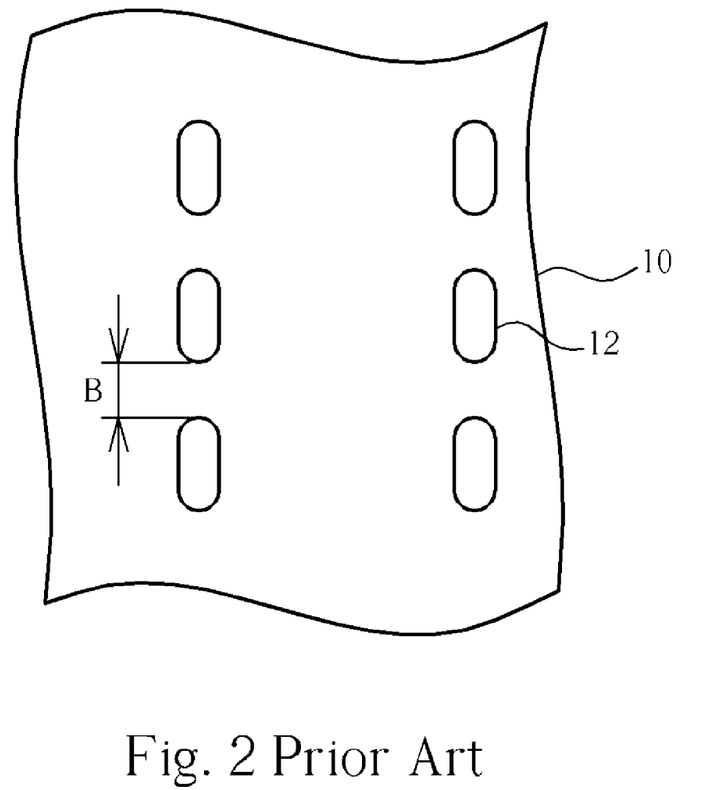
FIG. 2 is a schematic diagram of the shadow mask for fabricating the organic light-emitting elements shown in FIG. 1.

Referring to FIG. 2, it is a schematic diagram of the shadow mask 10 for fabricating the organic light-emitting element 20 shown in FIG. 1 according to the prior art. The traditional shadow mask 10 comprises a plurality of openings 12. While the organic light-emitting elements 20 are being fabricated, the light-emitting layers 22 are formed on the substrate 16 through the opening 12 of the shadow mask 10. Therefore, the size and distance of the openings 12 determine the distance of any two adjacent organic light-emitting elements 20, and moreover control the size and density of the sub-pixel regions 24, 26, 28. Currently, the shadow mask 10 is mostly fabricated by a photolithography-etching process or an electro-forming process. Under the technology limit of these processes, a minimum distance B exists between two neighboring openings 12 in order to make the shadow mask 10 have enough strength, which becomes the bottleneck of the progress in increasing the light-emitting areas of the sub-pixel regions 24, 26, 28.

Moreover, since the lifetime of a general organic light-emitting element will be shorten following the increase of the operating current, and the blue light organic light-emitting element has the shortest lifetime among red, green and blue light organic light-emitting elements, how to adjust the location allocation of these sub-pixel regions to improve the density of the pixel regions and the lifetime of the display is still an important topic for the industry in need of researching.

SUMMARY OF THE INVENTION

It is an objective of the claimed invention to provide an electroluminescent display having sub-pixel regions with various areas to solve the problems of the prior-art OLEDs such as uneven lifetime and the difficulty of improvement of the opening ratio.

According to the claimed invention, the electroluminescent display comprises a substrate with a plurality of pixel regions, each of which has a first sub-pixel region, a second sub-pixel region, and a third sub-pixel region. The electroluminescent display of the claimed invention further comprises a plurality of first color light-emitting layers, a plurality of second color light-emitting layers, and a plurality of third color light-emitting layers positioned on the substrate. Each first color light-emitting layer is positioned in the first sub-pixel region, and each second color light-emitting layer is position in two adjacent second sub-pixel regions. In one single pixel region, the area of the first sub-pixel region is larger than that of the second sub-pixel region.

It is an advantage of the claimed invention that the electroluminescent display comprises sub-pixels with various areas and one single color light-emitting layer may be used in different sub-pixel regions simultaneously, so that the lifetime and the operation voltage of the organic or non-organic light-emitting elements may be adjusted by designing the arrangement and areas of the sub-pixel regions. Accordingly, the density of the sub-pixel regions can be increased to improve the entire resolution of the electroluminescent display.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an electroluminescent display, for example, an OLED or an inorganic light-emitting diode display.

Figure 3:
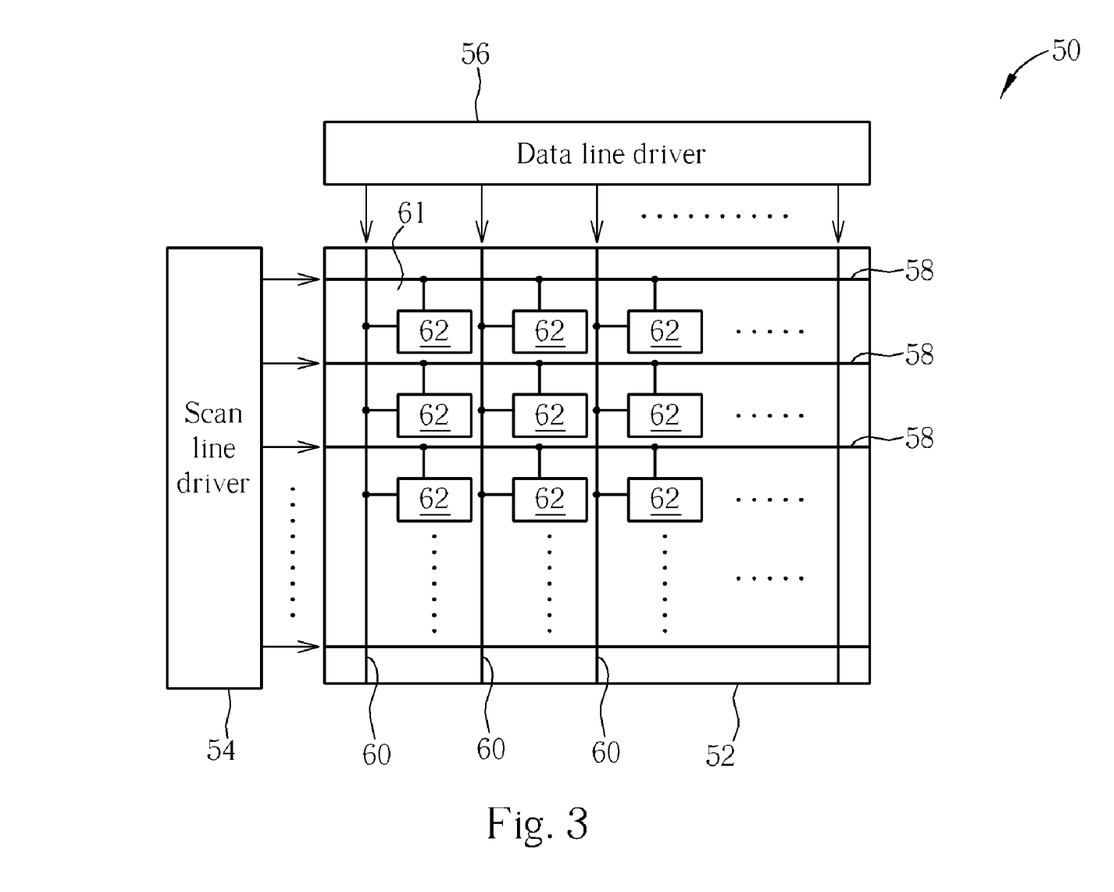
FIG. 3 is a schematic diagram of an OLED according to a first embodiment of the present invention.

With reference to FIG. 3, FIG. 3 is a schematic diagram of an OLED 50 according to a first embodiment of the present invention. The OLED 50 comprises a display panel 52, at least one scan line driver 54, and at least one data line driver 56. Wherein a plurality of scan lines 58 and a plurality of data lines 60 perpendicular to the scan lines 58 are disposed on the display panel 52, defining a plurality of sub-pixel regions 61 arranged as an array. Each sub-pixel region 61 comprises a sub-pixel circuit 62 electrically connected to the corresponding scan line 58 and data line 60. Generally, the scan line driver 54 and the data line driver 56 provide signals to the scan lines 58 and data lines 60 respectively to enable sub-pixel circuits 62 to produce colorful light with various gray levels in the display regions of the sub-pixel regions 61 according to the image data, so as to display images.

Figure 4:
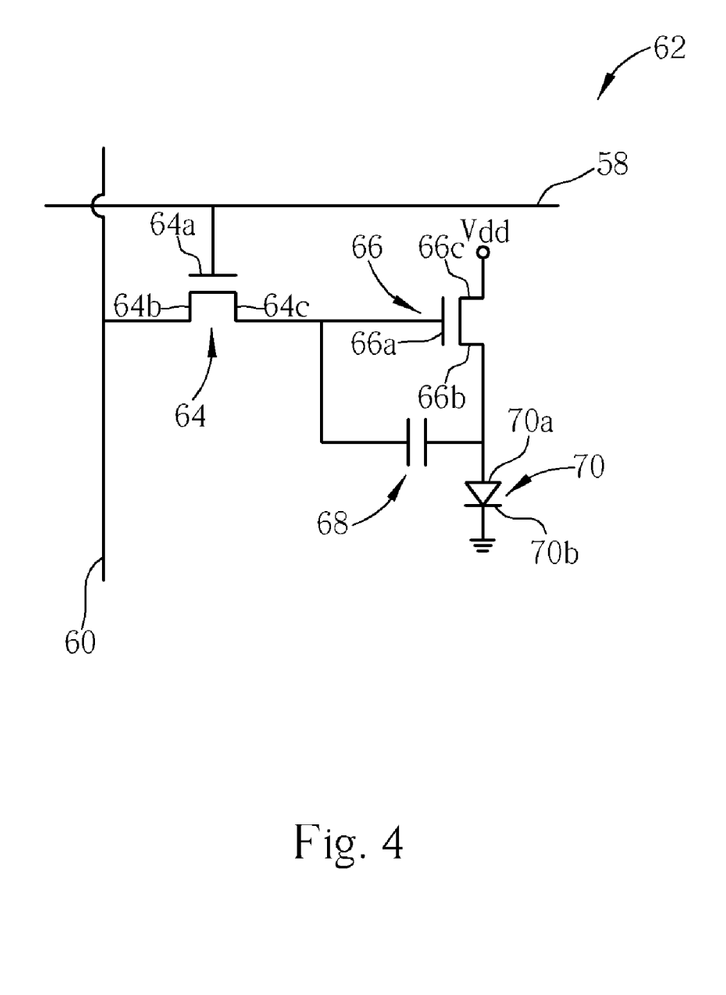
FIG. 4 is a schematic diagram of the sub-pixel circuit shown in FIG. 3.

Referring to FIG. 4, FIG. 4 is a schematic diagram of the sub-pixel circuit 62 shown in FIG. 3. Taking an active matrix OLED as an example, the sub-pixel circuit 62 comprises thin-film transistors 64 and 66, a storage capacitor 68, and an organic light-emitting element 70. The gate 64a and drain 64b of the thin-film transistor 64 are electrically connected to the scan line 58 and the data line 60 respectively. The gate 66a of the thin-film transistor 66 is electrically connected to the source 64c of the thin-film transistor 64 and a node of the storage capacitor 68. The source 66c and the drain 66b of the thin-film transistor 66 are electrically connected to an external power source Vdd and the anode 70a of the organic light-emitting element 70, and the cathode 70b of the organic light-emitting element 70 is grounded. Therefore, the thin-film transistor 64 disposed in the sub-pixel region 61 can control the light-emitting performance of the corresponding sub-pixel region 61.

Figure 5:
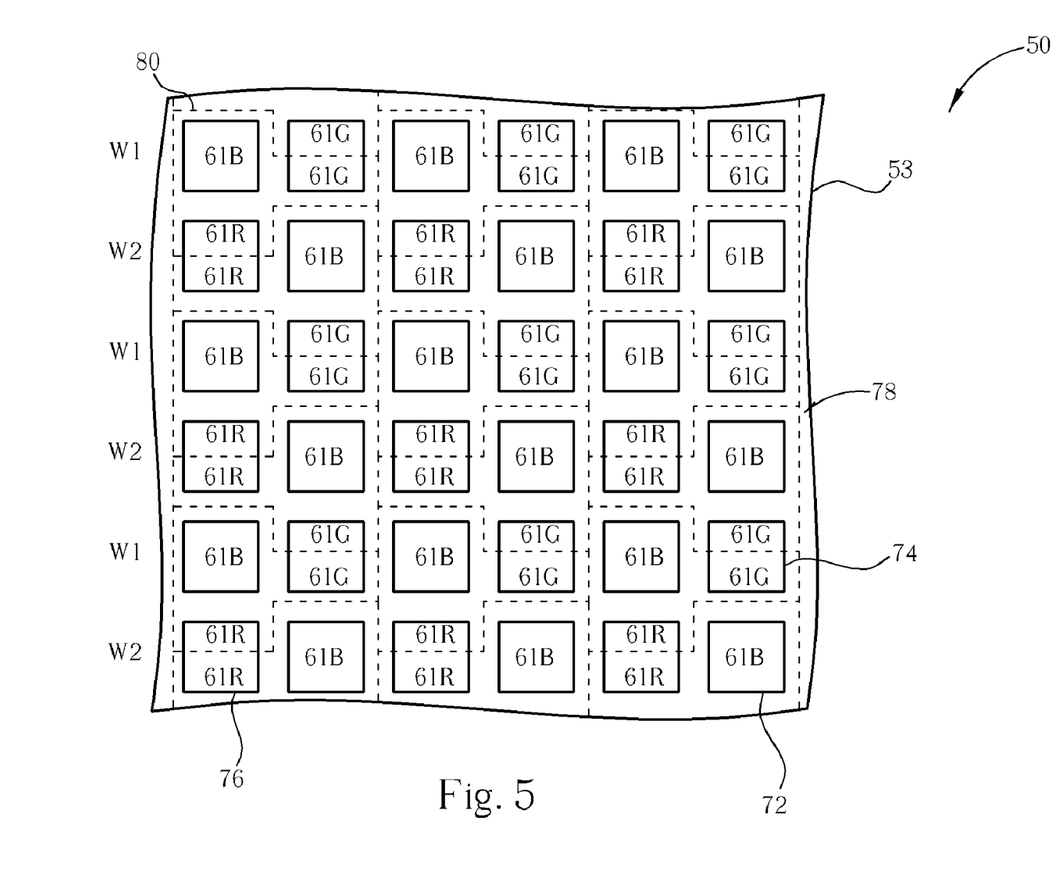
FIG. 5 is a schematic diagram of an arrangement of the sub-pixel regions of the OLED shown in FIG. 3 according to a first embodiment of the present invention.

To improve the performance of the display affected by the various lifetime of different color light emitting materials, the present invention provides the structure of an OLED 50 with special arrangements of sub-pixel regions 61. FIG. 5 is a schematic diagram of the arrangement of the sub-pixel regions 61 of the OLED 50 shown in FIG. 3 according to a first embodiment of the present invention. The organic light-emitting display panel 52 comprises a substrate 53 having a plurality of pixel regions 80 as indicated by the dotted lines. In this embodiment, every pixel region 80 comprises three sub-pixel regions 61 including the first sub-pixel region 61B, the second sub-pixel region 61G, and the third sub-pixel region 61R, arranged as an array 78. The first sub-pixel region 61B, the second sub-pixel region 61G, and the third sub-pixel region 61R respectively indicate three kinds of sub-pixels producing different color lights, such as blue light B, green light G, and red light R. The array 78 comprises a plurality of rows W1 and W2, wherein each of the odd rows W1 is an alternation of one first sub-pixel region 61B and two second sub-pixel regions 61G, and each of the even rows W2 is an alternation of two third sub-pixel regions 61R and one first sub-pixel region 61B. In addition, the first sub-pixel regions 61B are not positioned adjacent to each other and are separated by two second sub-pixel regions 61G or two third sub-pixel regions 61R.

Moreover, the display panel 52 further comprises a plurality of first color light-emitting layers 72, a plurality of second color light-emitting layers 74, and a plurality of third color light-emitting layers 76 with about the same areas. By taking the above-mentioned blue light, green light, and red light as an example, the first color light-emitting layers 72, the second color light-emitting layers 74, and the third color light-emitting layers 76 may be blue light-emitting layers, green light-emitting layers, and red light-emitting layers respectively, and may be fabricated by the shadow mask 10 as indicated in FIG. 2 individually, so that they have areas with the same size. According to FIG. 5, each first color light-emitting layer 72 is positioned in a single first sub-pixel region 61B, while each second color light-emitting layer 74 is positioned in two adjacent second sub-pixel regions 61G, and each third color light-emitting layer 76 is positioned in two neighboring third sub-pixel regions 61R at the same time. Since a single second color light-emitting layer 74 or a single third color light-emitting layer 76 is positioned in two neighboring sub-pixel regions 61 (in two second sub-pixel regions 61G or two third sub-pixel regions 61R), the area of a single first sub-pixel region 61B is larger than that of a single second sub-pixel region 61G or a single third sub-pixel region 61R within a pixel region 80. In this embodiment, the area of a first sub-pixel region 61B may be about $9 \times 10^{-4}$ to $2.25 \times 10^{-2}$ square millimeters ($mm^2$), which is about twice as the area of one single second sub-pixel region 61G or one single third sub-pixel region 61R. However, in other embodiments, the area of a single first sub-pixel region 61B may be 1.3 to 6 times larger than the area of a single second sub-pixel region 61G or of a single third sub-pixel region 61R.

According to the present invention, a single color light-emitting layer, such as the second or a third color light-emitting layer 74, 76, may be applied in two sub-pixel regions at the same time, such as the second or third sub-pixel regions 61G, 61R. As a result, when fabricating the color light-emitting layers by utilizing shadow masks with the openings having the same size as the prior art, one single color light-emitting layer can be applied to two sub-pixel regions, which increases the density of pixel arrangement and further improves the entire resolution of the OLED. In addition, in order to overcome the problem of the short lifetime of the blue light-emitting layer, the area of the first sub-pixel region 61B which produces blue light is twice as the areas of the second and third sub-pixel regions 61G and 61R, as shown in FIG. 5. Therefore, the operation voltage of the first sub-pixel regions 61B can be smaller than the operation voltage of the second sub-pixel region 61G or the third sub-pixel region and 61R so as to extend the lifetime of the first sub-pixel regions 61B. As a result, the blue, green, and red organic light-emitting elements 70 of the OLED 50 have uniform lifetimes.

Figure 6:
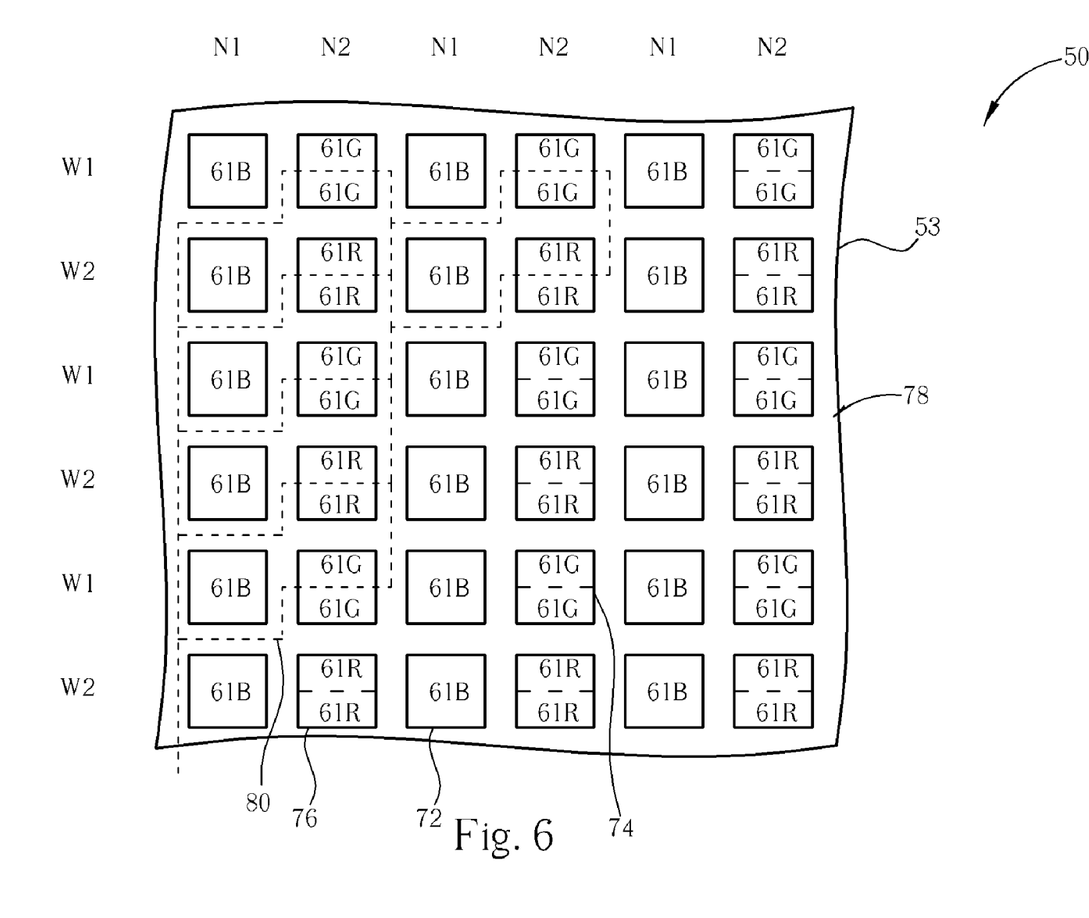
FIGS. 6-9 are schematic diagrams of the OLEDs according to the second to fifth embodiments of the present invention.

FIGS. 6-9 are schematic diagrams of OLEDs according to the second to the fifth embodiments of the present invention. To simplify explanation, all the element symbols in FIG. 6 to FIG. 9 are the same as those used in FIG. 5. With reference to FIG. 6, according to the second embodiment of the present invention, a plurality of pixel regions 80 is disposed on the substrate 53. Each pixel region 80 comprises a first sub-pixel region 61B, a second sub-pixel region 61G, and a third sub-pixel region 61R to form an array 78. The array 78 comprises a plurality of rows W1 and W2 and a plurality of columns N1 and N2. Each of the odd rows W1 is composed of the first sub-pixel regions 61B and the second sub-pixel regions 61G, and is an alternation of one first sub-pixel region 61B and two sub-pixel regions 61G. Each of the even rows W2 is composed of the first sub-pixel regions 61B and the third sub-pixel regions 61R, and is an alternation of one first sub-pixel region 61B and two third sub-pixel regions 61R. The difference of this embodiment from the first embodiment is that the first sub-pixel regions 61B in the neighboring rows W1 and W2 of this embodiment are next to each other and arranged as the odd columns N1, and the second sub-pixel regions 61G and the third sub-pixel regions 61R neighborly arranged as the even columns N2.

Figure 7:
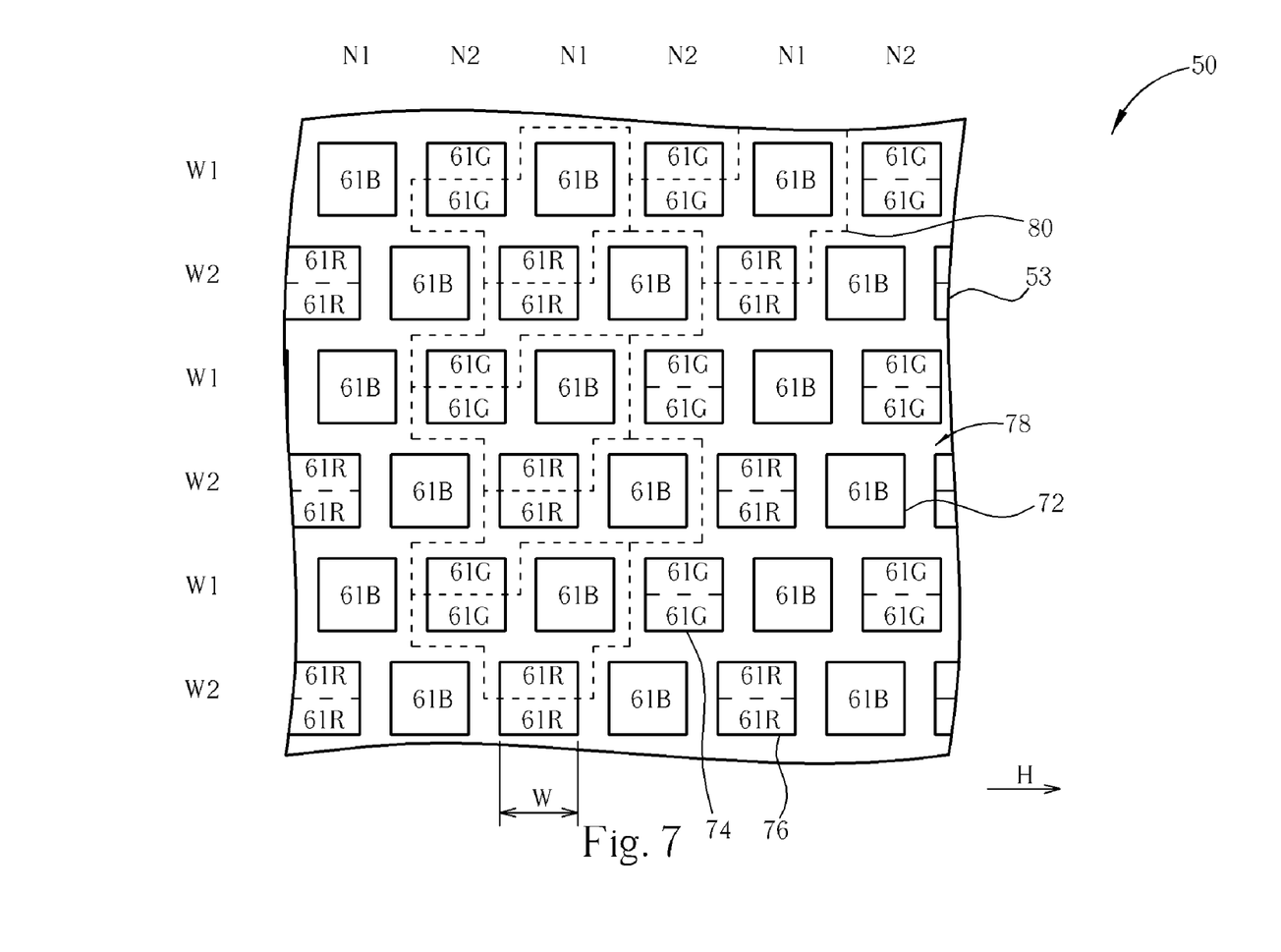

Referring to FIG. 7, according to the third embodiment of the present invention, the area of the first sub-pixel regions 61B is twice as the area of the second sub-pixel regions 61G or the area of the third sub-pixel region 61R. Each of the odd rows W1 of the array 78 is an alternation of one first sub-pixel region 61B and two second sub-pixel regions 61G, and each of the even rows W2 is an alternation of one first sub-pixel region 61B and two third sub-pixel regions 61R. Furthermore, the even rows W2 are shifted along a horizontal direction by a distance of half of the width W of the first color light-emitting layers 72 in comparison with the odd rows W1. As a result, the first sub-pixel regions 61B in the neighboring rows W1 and W2 are vertically adjacent to each other by the distance of half of the width W of the first color light-emitting layers 72 and arranged as a plurality of curved odd columns N1. The second and the third sub-pixel regions 61G and 61R are also away from each other by half of the width W of the second or the third color light-emitting layers 74 or 76, and are vertically adjacent to each other to form a plurality of curved even columns N2.

Figure 8:
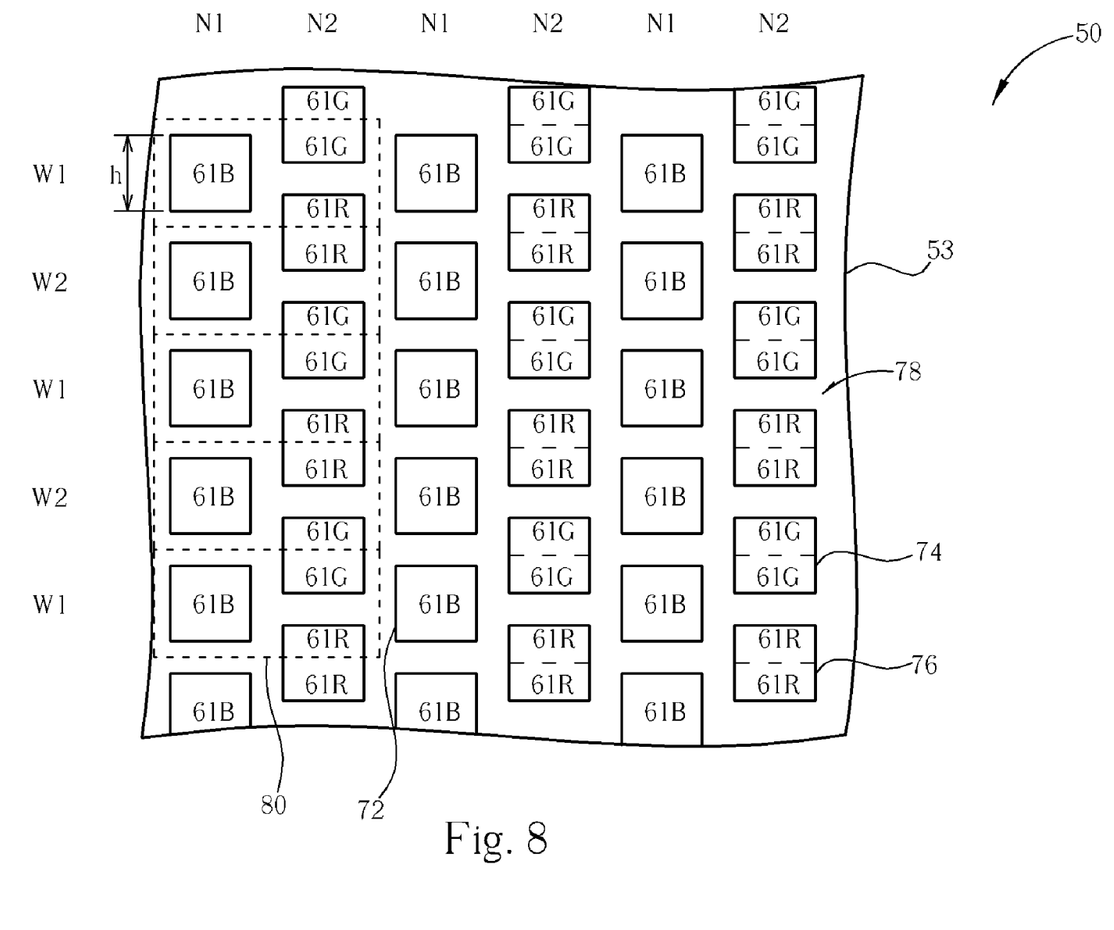

With reference to FIG. 8, the OLED 50 of the forth embodiment of the present invention comprises a plurality of pixel regions 80 positioned on the substrate 53. Each pixel regions 80 has three sub-pixel regions including the first, the second, and the third sub-pixel regions 61B, 61G, and 61R arranged as an array 78. The area of the first sub-pixel regions 61B is larger than the areas of the second sub-pixel regions 61G and the third sub-pixel regions 61R. For example, it may be 1.3 to 6 times larger than the area of the second or the third sub-pixel regions 61G, 61R. The first sub-pixel regions 61B are vertically adjacent to each other to form the odd columns N1. Two second sub-pixel regions 61G and two third sub-pixel regions 61R are disposed side by side along the vertical direction and alternately form the even rows N2. In addition, every first color light-emitting layer 72 is only positioned in one single first sub-pixel region 61B. Every second color light-emitting layer 74 and every third color light-emitting layer 76 are respectively positioned in two second sub-pixel regions 61G and two third sub-pixel regions 61R at the same time. Therefore, each even column N2 is also an alternation of a second color light-emitting layer 74 and a third color light-emitting layer 76. Moreover, the array 78 also comprises a plurality of rows W1 and W2, each of which is an alternation of a second and a third sub-pixel regions 61G, 61R and a first sub-pixel region 61B.

Figure 9:
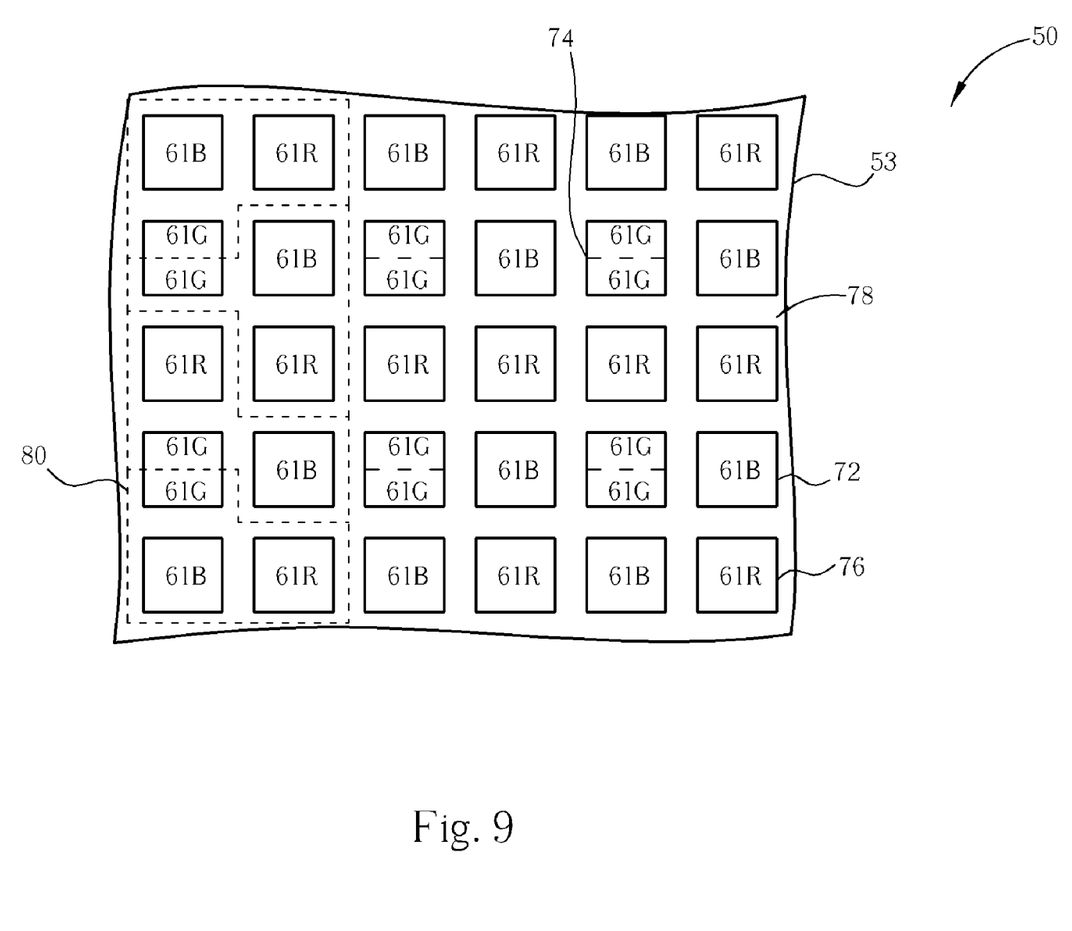

FIG. 9 is the schematic diagram of the arrangement of the sub-pixel regions 61 of the OLED 50 according to a fifth embodiment of the present invention. It is different from the previous embodiments that each of the third color light-emitting layers 76 is only positioned in one single sub-pixel region 61R in this embodiment, while each of the second color light-emitting layers 74 is still positioned in two neighboring second sub-pixel regions 61G at the same time. Accordingly, the area of each first sub-pixel region 61B and the area of each third sub-pixel region 61R are approximately the same and are larger than the area of each second sub-pixel region 61G, such as 1.3 to 6 times (preferable 2 times) larger than the area of each second sub-pixel region 61G. When the OLED 50 of the present invention is under operation, the operation voltages of the first sub-pixel regions 61B and the third sub-pixel regions 61R may be lower than that of the second sub-pixel regions 61G, so that the lifetimes of the first color light-emitting layers 72 and the third color light-emitting layers 76 can be extended. In other embodiments of the present invention, the arrangement of the first, the second, and the third sub-pixel regions 61B, 61G, 61R may be different according to the requirements of the product design, so that they may have various relative positions and sizes of areas. In addition, the first, the second, and the third sub-pixel regions 61B, 61G, 61R may individually represent sub-pixel regions producing color light other than blue, green, and red lights. For example, the second sub-pixel regions 61G may comprise cyan light-emitting layers, magenta light-emitting layers, or yellow light-emitting layers so as to produce cyan light, magenta light, or yellow light. In the above embodiments, the materials of the color light-emitting layers may comprise organic light-emitting materials, such as small molecule materials or polymer materials, or inorganic light-emitting materials. Therefore, although OLEDs are used for explaining the arrangements of the sub-pixel regions and color light-emitting layers in the above embodiments, the application field is not limited. In other words, the arrangements of the color light-emitting layers and sub-pixel regions in these embodiments can be applied to all kinds of electroluminescent displays.

According to the design of the present invention, one single color light-emitting layer may be applied to two or more sub-pixel regions at the same time even though all the color light-emitting layers are formed by use of the shadow masks with openings having the same size in contrast to the prior art, so that the resolution of the display device can be increased. In addition, the structure of the electroluminescent display of the present invention is designed to have various areas of different sub-pixel regions according to the operation lifetimes and qualities of the corresponding color light-emitting layers, so that different sub-pixel regions can have different operation voltages and brightness. As a result, the traditional limitation of operation conditions of the color light-emitting layers that have a short lifetime is overcome, so as to extend the overall lifetime of the electroluminescent display.

Those skilled in the art will readily observe that numerous modifications and alterations of the device and method may be made while retaining the teachings of the invention.

What is claimed is:

1. An electroluminescent display comprising:
a substrate having a plurality of pixel regions, each of the pixel regions including a first sub-pixel region, a second sub-pixel region, and a third sub-pixel region; and
a plurality of first color light-emitting layers, a plurality of second color light-emitting layers, and a plurality of third color light-emitting layers disposed on the substrate, each of the first color light-emitting layers being positioned in each of the first sub-pixel regions respectively, and each of the second color light-emitting layers being positioned in two adjacent second sub-pixel regions, and two adjacent second sub-pixel regions of two different pixel regions being contained within one continuous second color light-emitting layer, wherein an area of the first sub-pixel region is larger than an area of the second sub-pixel region in the single pixel region, and wherein each of the first color light-emitting layers comprises a blue light-emitting layer;
wherein each of the first sub-pixel region comprises a first driving transistor and a first switching transistor, each of the second sub-pixel region comprises a second driving transistor and a second switching transistor, and each of the third sub-pixel region comprises a third driving transistor and a third switching transistor, wherein the first sub-pixel regions, the second sub-pixel regions, and the third sub-pixel regions are arranged as an array that comprises a plurality of rows, each of the odd rows of the array is an alternation of one first sub-pixel region and two second sub-pixel regions, and each of the even rows of the array is an alternation of two third sub-pixel regions and one first sub-pixel regions, and wherein the first sub-pixel regions are not positioned adjacent to each other and are separated by two second sub-pixel regions or two third sub-pixel regions.

2. The electroluminescent display of claim 1, wherein each of the third color light-emitting layers is positioned in two adjacent third sub-pixel regions, two adjacent third sub-pixel regions of two different pixel regions are contained within one continuous third color light-emitting layer, and the area of the first sub-pixel region is larger than an area of the third sub-pixel region in the single pixel region.

3. The electroluminescent display of claim 1, wherein the area of the first sub-pixel region is about twice as an area of the third sub-pixel region.

4. The electroluminescent display of claim 1, wherein each of the third color light-emitting layers is positioned in only one third sub-pixel region, and an area of the third sub-pixel region is larger than the area of the second sub-pixel region in a single pixel region.

5. The electroluminescent display of claim 1, wherein the first sub-pixel regions in the adjacent rows are adjacent to each other and arranged as a plurality of columns.

6. The electroluminescent display of claim 1, wherein the even rows are shifted from the odd rows along a horizontal direction by a distance of a half width of the first color light-emitting layers.

7. The electroluminescent display of claim 1, wherein the area of the first sub-pixel regions is about twice as the area of the second sub-pixel regions.

8. The electroluminescent display of claim 1, wherein the area of the first sub-pixel region is 1.3 to 6 times larger than the area of the second sub-pixel regions.

9. The electroluminescent display of claim 8, wherein the area of the first sub-pixel regions is 1.3 to 6 times larger than an area of the third sub-pixel regions.

10. The electroluminescent display of claim 1, wherein each of the second color light-emitting layers comprises a green light-emitting layer.

11. The electroluminescent display of claim 1, wherein each of the second color light-emitting layers comprises a green light-emitting layer and each of the third color light-emitting layers comprises a red light-emitting layer.

12. The electroluminescent display of claim 1, wherein each of the third color light-emitting layers comprises a red light-emitting layer.

13. The electroluminescent in claim 1, wherein each of the second color light-emitting layers comprises a cyan light-emitting layer, a magenta light-emitting layer, or a yellow light-emitting layer.

14. The electroluminescent display of claim 1, wherein the area of the first sub-pixel region is about $9 \times 10^{-4}$ square millimeters ($mm^2$) to $2.25 \times 10^{-2}$ $mm^2$.

15. The electroluminescent display of claim 1, wherein areas of the first color light-emitting layer, the second color light-emitting layer, and the third light-emitting layer are approximately the same.

16. The electroluminescent display of claim 1, wherein the first light-emitting layers, the second light-emitting layers, and the third light-emitting layers comprise organic light-emitting layers.

17. The electroluminescent display of claim 1, wherein each of the plurality of pixel regions is a quadrangle.

18. An electroluminescent display comprising:
a plurality of scan lines and a plurality of data lines defining a plurality of first, second and third sub-pixel regions, wherein each of the first, second and third sub-pixel regions comprises a sub-pixel circuit electrically connected to the corresponding scan line and data line, and wherein the sub-pixel circuit comprises two transistors; and
a plurality of first color light-emitting layers, a plurality of second color light-emitting layers, and a plurality of third color light-emitting layers disposed on the substrate, each of the first color light-emitting layers being positioned in each of the first sub-pixel regions respectively, and each of the second color light-emitting layers being positioned in two adjacent second sub-pixel regions, and two adjacent second sub-pixel regions being contained within one continuous second color light-emitting layer, wherein an area of the first sub-pixel region is larger than an area of the second sub-pixel region in the single pixel region, wherein each of the first color light-emitting layers comprises a blue light-emitting layer;
wherein the first sub-pixel regions, the second sub-pixel regions, and the third sub-pixel regions are arranged as an array that comprises a plurality of rows, each of the odd rows of the array is an alternation of one first sub-pixel region and two second sub-pixel regions, and each of the even rows of the array is an alternation of two third sub-pixel regions and one first sub-pixel regions, and wherein the first sub-pixel regions are not positioned adjacent to each other and are separated by two second sub-pixel regions or two third sub-pixel regions.

* * * * *